United States Patent
Nadd

(10) Patent No.: US 6,963,498 B2
(45) Date of Patent: Nov. 8, 2005

(54) BOOTSTRAP CAPACITOR REFRESH CIRCUIT

(75) Inventor: Bruno C. Nadd, Lourmarin (FR)

(73) Assignee: International Rectifier Corporation, El Segundo, CA (US)

(*) Notice: Subject to any disclaimer, the term of this patent is extended or adjusted under 35 U.S.C. 154(b) by 74 days.

(21) Appl. No.: 10/770,637

(22) Filed: Feb. 2, 2004

(65) Prior Publication Data

US 2005/0168206 A1    Aug. 4, 2005

(51) Int. Cl.$^7$ .................... H02M 3/335; H03B 1/00
(52) U.S. Cl. .................... 363/26; 363/98; 327/589; 327/108
(58) Field of Search .................... 363/16, 24–26, 363/95–98, 132; 323/299, 222; 327/390, 327/434, 108, 589

(56) References Cited

U.S. PATENT DOCUMENTS

| | | | | |
|---|---|---|---|---|
| 5,155,670 | A * | 10/1992 | Brian | 363/24 |
| 5,408,150 | A * | 4/1995 | Wilcox | 327/108 |
| 5,563,759 | A * | 10/1996 | Nadd | 361/101 |
| 5,977,725 | A * | 11/1999 | Miyazaki et al. | 315/291 |
| 6,094,095 | A * | 7/2000 | Murray et al. | 327/589 |
| 6,172,493 | B1 * | 1/2001 | Grant | 323/288 |
| 6,717,459 | B2 * | 4/2004 | Blodgett | 327/536 |

* cited by examiner

*Primary Examiner*—Rajnikant B. Patel
(74) *Attorney, Agent, or Firm*—Ostrolenk, Faber, Gerb & Soffen, LLP

(57) ABSTRACT

A bootstrap capacitor charging circuit comprising first and second power switching transistors arranged in a half bridge arrangement such that the first and second transistors are disposed between a high side potential and a low side potential, a driver circuit for driving the first and second transistors, a bootstrap capacitor adapted to be charged from a potential source and for providing a voltage source to power an electronic circuit, a charging circuit providing a charging path from one of the high and low side potentials to the bootstrap capacitor, first and second series connected switches arranged between a common node of the first and second transistors and one of the high and low side potential, the bootstrap capacitor having a first terminal coupled to be charged by the charging circuit and a second terminal coupled to a common node between the first and second series connected switches; and a control circuit operating in first and second modes, wherein in a first mode when the first and second power switching transistors are switching at a rate above a predetermined frequency, a first of the switches connected to the common node of the first and second power switching transistors is controlled on and the second switch is controlled off; and wherein, when the first power switching transistor is on for a duration of time exceeding a preset duration, the control circuit operates in a second mode wherein the first and second switches are alternately turned on and off for first and second predefined periods of time whereby the bootstrap capacitor charges through the second switch and the charging circuit during the second predefined period of time.

9 Claims, 3 Drawing Sheets

BOOTSTRAP CAPACITOR REFRESH CIRCUIT

BACKGROUND OF THE INVENTION

The present invention relates to power switching circuits and, in particular, to driver circuits for driving power switching circuits. In particular, the present invention relates to a bootstrap capacitor power supply refresh circuit utilized in a driver circuit for driving a power switching circuit, for example, a half bridge power switching circuit driving a load.

Bootstrap capacitors are often employed in driver circuits to provide an additional fkiatubg voltage from an existing power supply or from an existing voltage source or from a pulsed signal source. In particular, as shown in FIG. 1, which shows a driver IC for driving a half bridge switching circuit comprising two power MOSFETs M1 and M2 driving a load, as shown there, the half bridge transistors M1 and M2 are arranged between a voltage source VBAT and ground. The voltage supply is also provided to the driver IC (IC) at a voltage input VCC to provide power to the driver IC. VBAT may be a different, higher voltage than VCC, or it may be the same voltage. Typically, VCC is different than VBAT because of high voltage spikes on VBAT. VCC may be derived from VBAT by an internal or external regulator circuit. The driver IC includes a driver HO and a driver LO which drive the respective high side and low side transistors M1 and M2. In addition, an external bootstrap capacitor CBOOT is provided between a terminal VB and the terminal VS which is coupled to the load and which is the common connection between the transistors M1 and M2. A supply voltage VBOOT is thus provided across the bootstrap capacitor. A diode D is disposed either internally to the IC or external to it to allow the bootstrap capacitor CBOOT to charge up from VCC when transistor M2 is on. The bootstrap supply is used to supply a votlage to the high side driver.

A problem arises when there is a permanent conduction of transistor M1. By "permanent conduction" is meant a relatively lengthy on time for transistor M1, for example, more than 200 usecs. In such a circumstance, transistor M2 is off and accordingly, the bootstrap capacitor cannot charge through transistor M2 during such operation. Accordingly, the circuit of FIG. 1 cannot be used if transistor M1 has relatively lengthy on times, for example conduction times greater than 200 usec. Transistor M2 will simply not be on long enough to allow the bootstrap capacitor to charge up and therefore provide a power source to circuits either internal to the IC or external to it that are powered by VBOOT.

It is therefore necessary to provide a solution to this problem, and particularly one that is useful in automotive applications.

SUMMARY OF THE INVENTION

It is an object of the present invention to provide a solution to the problem of the prior art bootstrap capacitor circuit wherein there is insufficient time during certain modes of operation of the switching transistors for the bootstrap capacitor to maintain a required charge.

The above and other objects of the present invention are achieved by a bootstrap capacitor charging circuit comprising first and second power switching transistors arranged in a half bridge arrangement such that the first and second transistors are disposed between a high side potential and a low side potential, a driver circuit for driving the first and second transistors, a bootstrap capacitor adapted to be charged from a potential source and for providing a voltage source to power an electronic circuit, a charging circuit providing a charging path from one of said high and low side potentials to said bootstrap capacitor, first and second series connected switches arranged between a common node of said first and second transistors and one of said high and low side potential, the bootstrap capacitor having a first terminal coupled to be charged by said charging circuit and a second terminal coupled to a common node between said first and second series connected switches; and a control circuit operating in first and second modes, wherein in a first mode when said first and second power switching transistors are switching at a rate above a predetermined frequency, a first of said switches connected to said common node of said first and second power switching transistors is controlled on and said second switch is controlled off; and wherein, when said first power switching transistor is on for a duration of time exceeding a preset duration, said control circuit operates in a second mode wherein said first and second switches are alternately turned on and off for first and second predefined periods of time whereby the bootstrap capacitor charges through said second switch and said charging circuit during the second predefined period of time.

The above and other objects are also achieved by a method for charging a bootstrap capacitor in a circuit comprising first and second power switching transistors arranged in a half bridge arrangement such that the first and second transistors are disposed between a high side potential and a low side potential, a driver circuit for driving the first and second transistors; a bootstrap capacitor adapted to be charged from a potential source and for providing a voltage source to power an electronic circuit; a charging circuit providing a charging path from one of said high and low side potentials to said bootstrap capacitor, first and second series connected switches arranged between a common node of said first and second transistors and one of said high and low side potential; the bootstrap capacitor having a first terminal coupled to be charged by said charging circuit and a second terminal coupled to a common node between said first and second series connected switches; and a control circuit for controlling the first and second switches, the method comprising operating said first and second switches in a first mode when said first and second power switching transistors are switching at a rate above a predetermined frequency, such that a first of said switches connected to said common node of said first and second power switching transistors is controlled on and said second switch is controlled off; and operating said first and second switches in a second mode when said first power switching transistor is on for a duration of time exceeding a preset duration, such that said first and second switches are alternately turned on and off for first and second predefined periods of time whereby the bootstrap capacitor charges through said second switch and said charging circuit during the second predefined period of time.

Other objects, features and advantages of the invention will become apparent from the detailed description that follows.

BRIEF DESCRIPTION OF THE DRAWING(S)

The invention will now be described in greater detail in the following detailed description with reference to the attached drawings in which.

Other objects, features and advantages of the present invention will become apparent from the detailed description that follows.

DETAILED DESCRIPTION OF THE INVENTION

Figure 1:
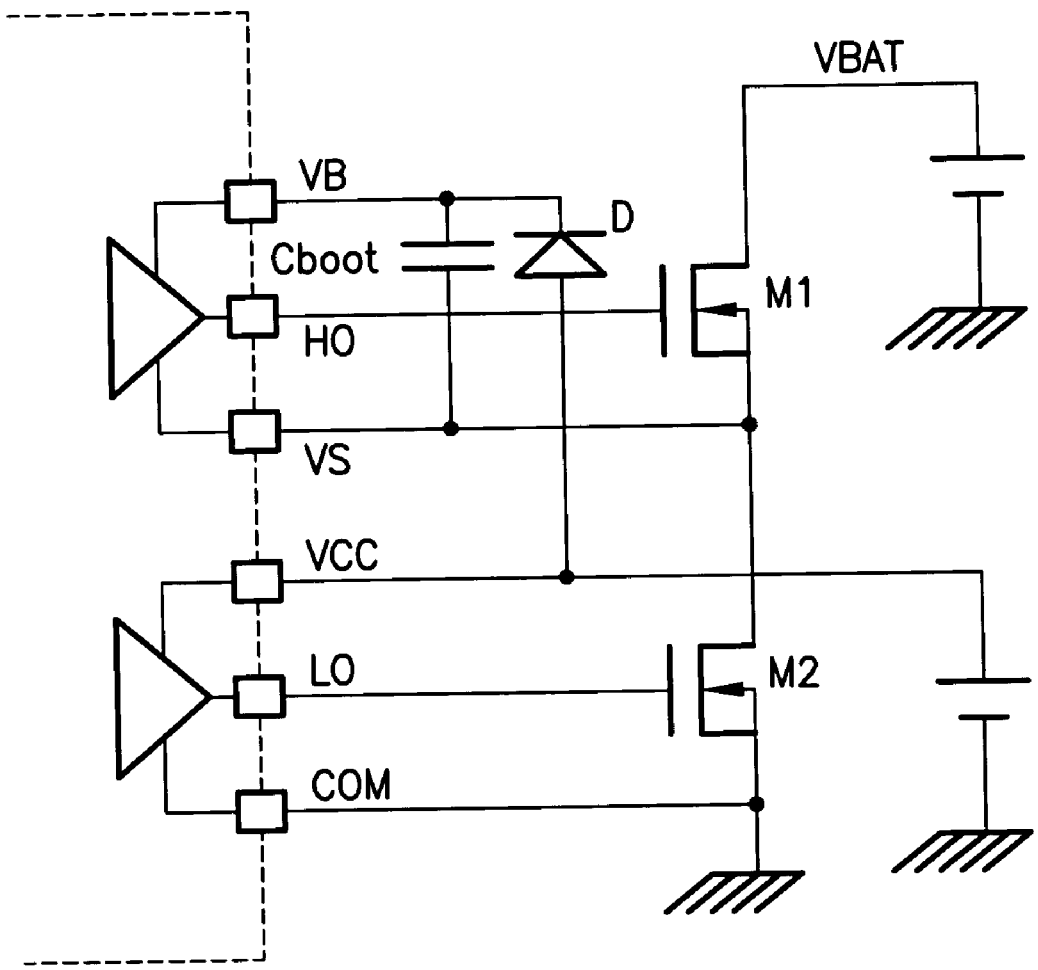
FIG. 1 shows a prior art circuit employing a bootstrap capacitor power supply.
Figure 2:
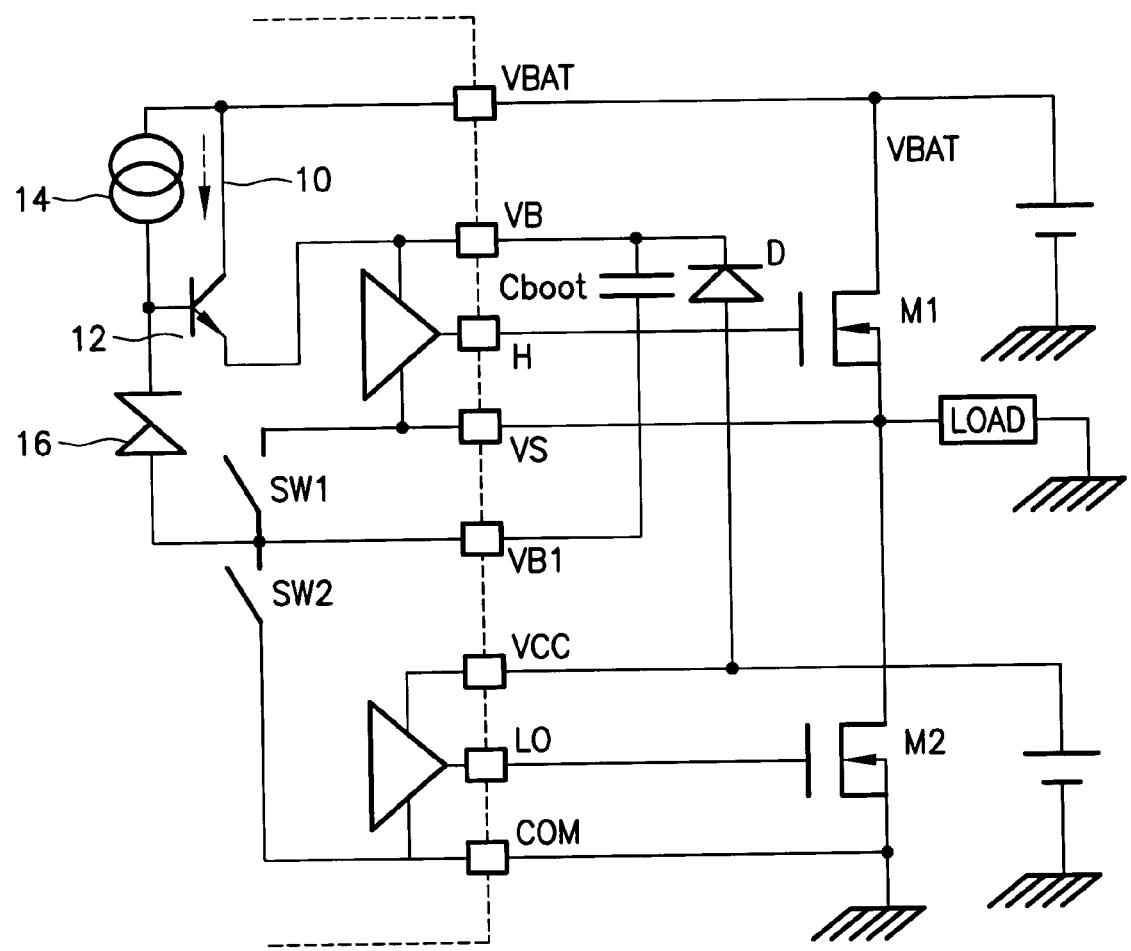
FIG. 2 shows the circuit according to the present invention.

With reference to FIG. 2, a driver integrated circuit (IC) for a half bridge switching transistor arrangement comprising transistors M1 and M2 series connected between power supply VBAT and ground is shown. The load is connected between the common node between transistors M1 and M2 comprising the point VS and ground.

The driver integrated circuit IC includes the high side and low side drivers HO and LO for each of the high side and low side power transistors M1 and M2. In addition, the driver IC includes a ballast regulator 10 comprising a transistor, for example, a bipolar NPN transistor 12 and a current source 14 as well as a zener diode 16 which may be a 6.6 volt zener diode in the illustrated embodiment. In addition, the bootstrap capacitor CBOOT is externally connected and separated from VS. The bootstrap capacitor is connected between the terminals VB and VB1 of the driver IC. Terminal VB1 is connected to the anode of zener diode 16 which is also connected to a switch SW2 which is connected to the common terminal and thence to ground. In addition, switch SW1 is connected between VS and VB1 as shown. Switches SW1 and SW2 are semiconductor switches, e.g., MOSFETs or bipolar transistors.

In addition, a control circuit 18 is provided which provides output signals SW1 and SW2 (FIG. 3) to control the switching action of the switches SW1 and SW2.

The circuit operates as follows. During normal operation, for conduction times of M1 less than 200 usec., controller 18 operates in a first mode (MODE 1—FIG. 3) such that switch SW1 is always on and switch SW2 is always off. As such, the circuit operates like a normal bootstrap power supply and the capacitor CBOOT is charged through M2 and the switch SW1 and the ballast regulator 10 to VBAT when M2 is on. The ballast regulator 10 provides a regulated voltage at the emitter of transistor 12 of approximately 6 volts, based on a 6.6 volt zener diode 16.

Figure 3:
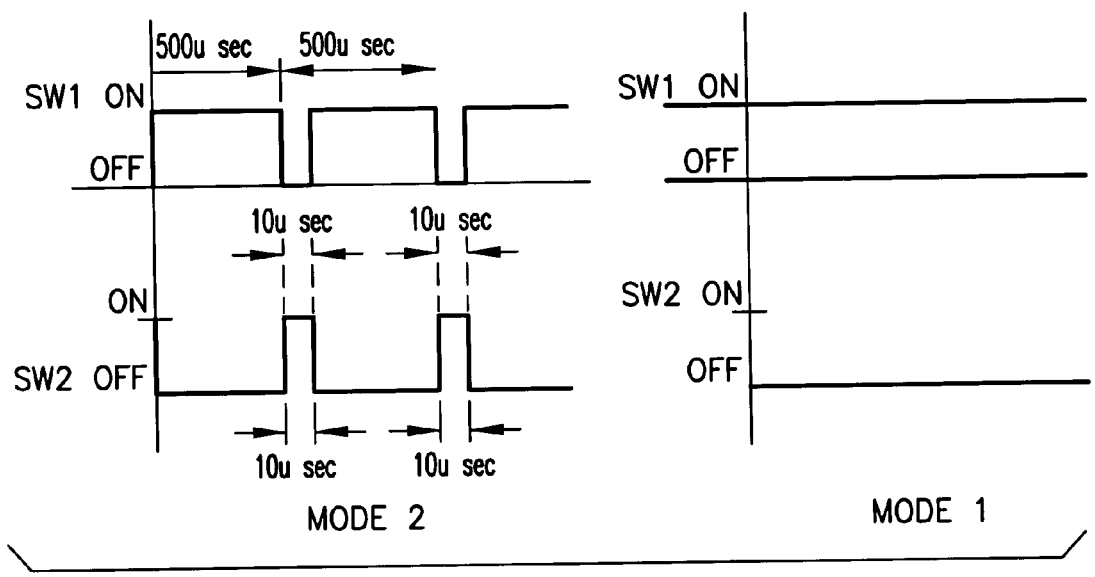
FIG. 3 shows a timing diagram useful for explaining the present invention.

When the transistor M1 is on for periods of time greater than 200 usec., in the prior art circuit there is insufficient time for the capacitor to charge through M2. In such a case, control circuit 18 operates in a second mode (MODE 2—FIG. 3). Circuit 18 has included therein an oscillator comprising a 2 kHz oscillator, for example. Every 500 usec, as shown in FIG. 3, switch SW1 is turned off and switch SW2 is turned on for a time period of approximately 10 μsec. The bootstrap capacitor CBOOT is charged up through SW2 coupled to ground and through the ballast regulator to VBAT. During this time, the gate of M1 may be left floating.

The present invention thus provides a simple and reliable way to charge a bootstrap capacitor so that power can reliably be provided to circuits coupled and powered by the bootstrap capacitor for all modes of operation of the power switching circuit, including when the high side transistor is in a permanent state of conduction.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A bootstrap capacitor charging circuit comprising:
   first and second power switching transistors arranged in a half bridge arrangement such that the first and second transistors are disposed between a high side potential and a low side potential;
   a driver circuit for driving the first and second transistors;
   a bootstrap capacitor adapted to be charged from a potential source and for providing a voltage source to power an electronic circuit;
   a charging circuit providing a charging path from one of said high and low side potentials to said bootstrap capacitor;
   first and second series connected switches arranged between a common node of said first and second transistors and one of said high and low side potential;
   the bootstrap capacitor having a first terminal coupled to be charged by said charging circuit and a second terminal coupled to a common node between said first and second series connected switches; and
   a control circuit operating in first and second modes, wherein in a first mode when said first and second power switching transistors are switching at a rate above a predetermined frequency, a first of said switches connected to said common node of said first and second power switching transistors is controlled on and said second switch is controlled off; and wherein; when said first power switching transistor is on for a duration of time exceeding a preset duration, said control circuit operates in a second mode wherein said first and second switches are alternately turned on and off for first and second predefined periods of time whereby the bootstrap capacitor charges through said second switch and said charging circuit during the second predefined period of time.

2. The bootstrap capacitor charging circuit of claim 1, wherein said control circuit is operative to turn said first and second switches alternately on and off during said second mode of operation such that the first switch is on and the second switch is off for the first period of time and the first switch is off and the second switch is on for the second period of time.

3. The bootstrap capacitor charging circuit of claim 2 wherein the first period of time is about 490 usecs the second period of time is about 10 usecs, and the preset duration is about 200 usecs.

4. The bootstrap capacitor charging circuit of claim 1, wherein the charging circuit comprises: a regulator transistor having its main terminals connected between the potential source for charging the bootstrap capacitor and said first terminal of the bootstrap capacitor; a current source coupled between the potential source and a control terminal of the regulator transistor and further comprising a regulator element for providing a reference voltage coupled between the control terminal of the regulator transistor and said common node between said first and second switches.

5. The bootstrap capacitor charging circuit of claim 1, wherein the charging circuit is coupled to the high side potential of said first and second switches are arranged between the common mode of the first and second transistors and said low side potential.

6. A method for charging a bootstrap capacitor in a circuit comprising first and second power switching transistors arranged in a half bridge arrangement such that the first and second transistors are disposed between a high side potential and a low side potential, a driver circuit for driving the first and second transistors; a bootstrap capacitor adapted to be charged from a potential source and for providing a voltage source to power an electronic circuit; a charging circuit providing a charging path from one of said high and low side potentials to said bootstrap capacitor, first and second series connected switches arranged between a common node of said first and second transistors and one of said high and low side potential; the bootstrap capacitor having a first terminal coupled to be charged by said charging circuit and a second terminal coupled to a common node between said first and second series connected switches; and a control circuit for controlling the first and second switches, the method comprising:

operating said first and second switches in a first mode when said first and second power switching transistors are switching at a rate above a predetermined frequency, such that a first of said switches connected to said common node of said first and second power switching transistors is controlled on and said second switch is controlled off; and operating said first and second switches in a second mode when said first power switching transistor is on for a duration of time exceeding a preset duration, such that said first and second switches are alternately turned on and off for first and second predefined periods of time whereby the bootstrap capacitor charges through said second switch and said charging circuit during the second predefined period of time.

7. The method of claim 5, wherein said step of operating said first and second switches in the second mode comprises turning said first and second switches alternately on and off such that the first switch is on and the second switch is off for the first period of time and the first switch is off and the second switch is on for the second period of time.

8. The method of claim 6 wherein the first period of time is about 490 usecs and the second period of time is about 10 usecs and the preset duration is about 200 usecs.

9. The method of claim 5, further comprising charging said bootstrap capacitor thorugh a charging circuit comprising a voltage regulator circuit.

* * * * *